United States Patent [19]

Jun

[11] Patent Number: 5,897,369
[45] Date of Patent: Apr. 27, 1999

[54] METHOD FOR FORMING INTERCONNECTION OF A SEMICONDUCTOR DEVICE

[75] Inventor: Young Kwon Jun, Seoul, Rep. of Korea

[73] Assignee: LG Semicon Co., Ltd., Chungcheongbuk-do, Rep. of Korea

[21] Appl. No.: 08/714,369

[22] Filed: Sep. 16, 1996

[30] Foreign Application Priority Data

May 16, 1996 [KR] Rep. of Korea ................. 96-16462

[51] Int. Cl.⁶ .......................................... H01L 21/441
[52] U.S. Cl. ..................... 438/629; 438/638; 438/639; 438/672
[58] Field of Search .................. 438/625, 629, 438/633, 638, 639, 672

[56] References Cited

U.S. PATENT DOCUMENTS

| | | | |
|---|---|---|---|
| 5,270,254 | 12/1993 | Chen et al. ............................. | 438/639 |
| 5,284,799 | 2/1994 | Sato ........................................ | 438/618 |
| 5,305,519 | 4/1994 | Yamamoto et al. .................... | 438/623 |
| 5,312,774 | 5/1994 | Nakamura et al. ..................... | 438/629 |
| 5,470,792 | 11/1995 | Yamada .................................. | 438/625 |
| 5,534,462 | 7/1996 | Fiordalice et al. ..................... | 438/634 |
| 5,592,024 | 1/1997 | Aoyama et al. ........................ | 257/751 |

OTHER PUBLICATIONS

Dual Damascene; A ULSI Wiring Technology Jun. 11–12, 1991 VMIC Conference TH–0359–0/91/0000–0144 $01.00 C 1991 IEEE,Carter W. Kaanta, et al, pp. 144–152.

*Primary Examiner*—John F. Niebling
*Assistant Examiner*—Ha Tran Nguyen

[57] ABSTRACT

A method for forming an interconnection of a semiconductor device, includes the steps of forming an insulating layer on a substrate on which a lower conductive layer is formed, selectively removing the insulating layer to form a first connecting hole and a second connecting hole for the pattern of an upper conductive layer, growing a first conductive material in the first connecting hole to form a buried plug and then depositing a second conductive material on the surface of the insulating layer to form a barrier layer, and depositing a third conductive material on the barrier layer to fill the second connecting hole and then patterning it to form an upper conductive layer.

29 Claims, 10 Drawing Sheets

METHOD FOR FORMING INTERCONNECTION OF A SEMICONDUCTOR DEVICE

BACKGROUND OF THE INVENTION

The present invention relates to a method for forming an interconnection of a semiconductor device which improves resistance and reliability of the semiconductor device.

In general, an aluminum and an alloy thin film made thereof have a high electric conductivity and a good pattern formation by a dry etching. Further, their adhesion to a silicon oxide film is good and the cost is relatively low. Thus, they are widely used as a material for forming the interconnection of a semiconductor circuit.

However, as the number of integrations for forming an integrated circuit increases, the size of semiconductor devices is reduced and their interconnections become finer and multi-layers. Thus, in parts of the semiconductor devices having a certain topology or the inside of a contact or via hole, step coverage becomes an important issue.

For example, a connecting hole becomes narrower as the size of the semiconductor device decreases. The narrow connecting hole has an aspect ratio (hole height/hole width) of greater than one. Thus, using a conventional sputtering method to deposit an interconnection film in the narrow connecting hole results in an uneven deposition, which can degrade the operation of the connecting hole, for example, by causing an open circuit. Such a poor step coverage arising due to a shadow effect should be avoided.

Accordingly, instead of the conventional sputtering method, there is introduced a chemical vapor deposition (CVD) method which can provide a uniform thickness deposition and thus a good step coverage. For a chemical vapor deposition, a tungsten film is used. Thus, researches to forming a tungsten film using a low pressure chemical vapor deposition (LPCVD) method has been progressed.

However, the resistance of the tungsten interconnection film is twice more than that of the aluminum interconnection film, so that it is difficult to actually apply and pattern the tungsten film as an interconnection film. To overcome this problem, forming a plug in a connecting hole has been suggested.

As one of the methods for forming a plug, a tungsten film is selectively grown on a substrate exposed in a connecting hole by applying a selective chemical vapor deposition method. In another method, after forming a barrier metal film or an adhesive layer, a tungsten film is deposited on the entire surface and etched back to a desired thickness to form the plug.

However, in the above selective growth method, it is not easy to prevent the tungsten film from growing on an insulating film surrounding the connecting hole. In the etching back method, it is necessary to form a reliable barrier layer or adhesive layer in the connecting hole with the high aspect ratio. To do this, a collimator or a CVD method is used. However, in such a case, a minimum thickness sufficient to cause a nuclear generation of the tungsten in the bottom or sidewall of the connecting hole should be secured. Here, the top surface of the connecting hole is actually positioned higher than that of the plug since the depth of the connecting hole is variable according to the degree of planarization of the insulating film.

On the other hand, if a CVD method is used to form an aluminum interconnection, the step coverage can be improved. At the same time, peripheral processes related to the technology of forming an aluminum interconnection using the conventional sputtering method can be utilized.

Nevertheless, copper has a resistance lower than that of the aluminum and a good electromigration or stressmigration characteristic, thereby offering good reliability. Accordingly, methods for forming an copper interconnection using a sputtering or CVD method have been researched.

However, if a halogen compound useful for etching the aluminum were applied to copper, the operation temperature for the copper should be raised to about 500° C. to obtain an applicable etch rate, since the vapor pressure of the halogen compound is low. Thus, instead of using a direct patterning through etching, a trench is formed in the shape of an interconnection pattern within a substrate to form the copper interconnection. Then the copper is deposited and etched back by a chemical mechanical polishing (CMP) method to form a buried conductive line. Alternatively, a method is suggested where a plug is selectively formed through a vertical growth using a lower conductive layer of a contact or via hole as a seed.

For forming a buried conductive line, a method has been suggested where a contact plug and a conductive line are self-aligned to uniformly maintain the contact area between the plug and the line. This forms a buried interconnection which has an improved contact resistance and integration capability.

Hereinafter, the conventional method for forming an interconnection of a semiconductor device will be described with reference to the attached drawing.

FIGS. 1*a* to 1*f* are cross-sectional views for illustrating the conventional method for forming an interconnection of a semiconductor device.

Figure 1A:
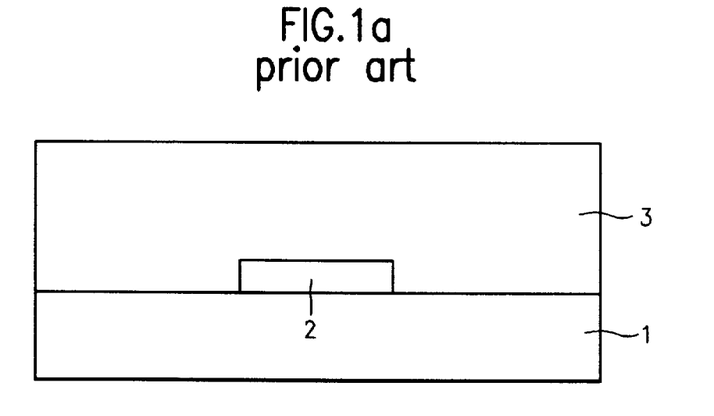
FIGS. 1a to 1f are cross-sectional views for illustrating a method for forming an interconnection of a semiconductor device.

To begin with, as shown in FIG. 1*a,* an insulating layer 3 is formed on a substrate 1 on which a lower conductive layer 2 is formed.

Figure 1B:
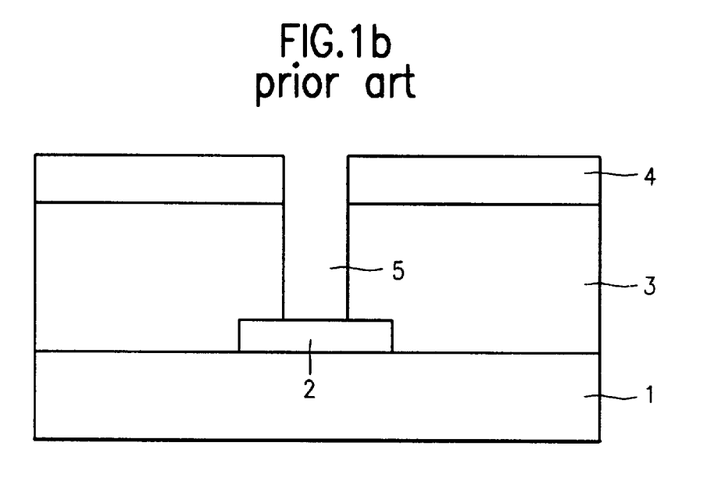

As shown in FIG. 1*b,* a first photoresist 4 is coated on the insulating layer 3 and patterned so as to expose a portion of the lower conductive layer 2.

Using the patterned first photoresist 4 as a mask, the insulating layer 3 is selectively removed to form a connecting hole 5 for connecting the lower conductive layer 2 with an upper conductive layer which will be formed by the subsequent processes.

Figure 1C:
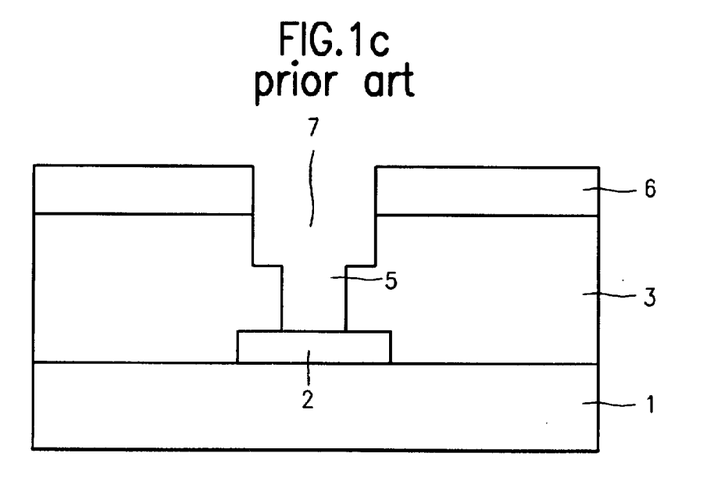

As shown in FIG. 1*c,* after removing the first photoresist 4, a second photoresist 6 is coated and patterned on the patterned insulating layer 3. Using the patterned second photoresist 6 as a mask, the insulating layer 3 is selectively removed to form a trench 7 for forming the upper conductive layer.

Figure 1D:
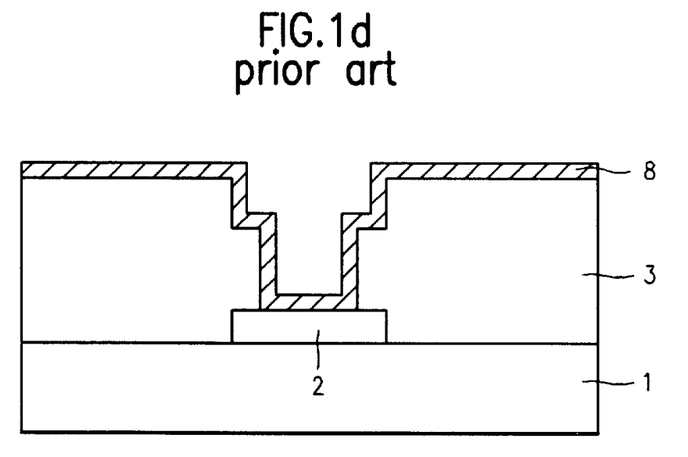

As shown in FIG. 1*d,* after removing the second photoresist 6, a barrier layer 8 made of a high refractory metal or a compound thereof is formed on the insulating layer 3 and the exposed lower conductive layer 2. Here, a titanium (Ti) can be used as the high refractory metal and a titanium nitride (TiN) can be used as its compound.

Figure 1E:
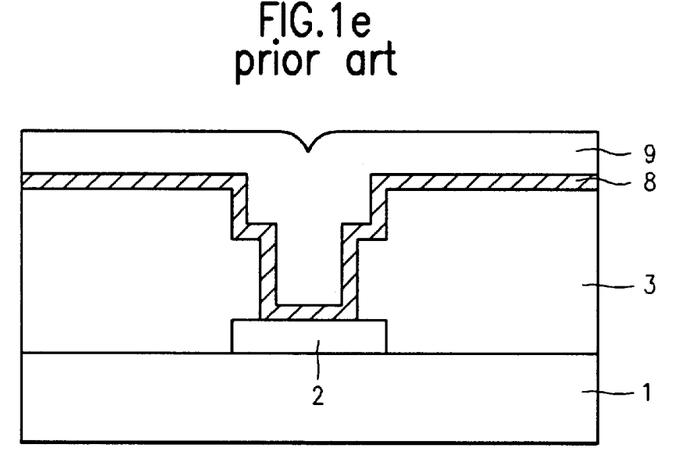

As shown in FIG. 1*e,* using a CVD or electrolytic deposition method, a conductive material such as copper is formed on the barrier layer 8, thereby forming an upper conductive layer 9 filling the connecting hole 5 and trench 7.

Figure 1F:
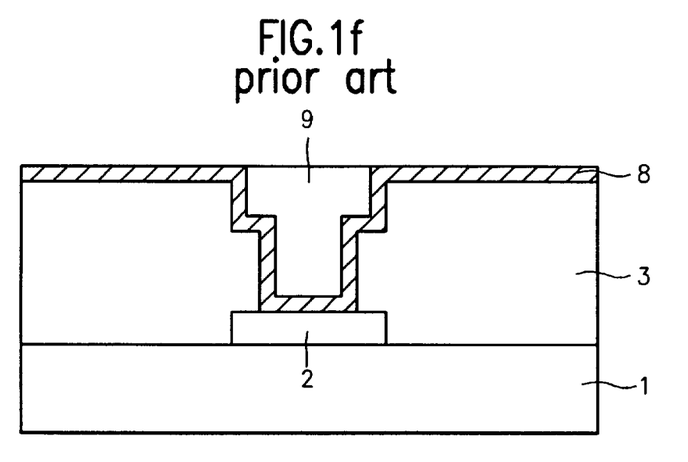

As shown in FIG. 1*f,* through a CMP (Chemical Mechanical Polishing) method, the upper conductive layer 9 is etched back until the surface of barrier layer 8 is exposed. This completes the conventional process of forming an interconnection of a semiconductor device. However, the aforementioned conventional method for forming an interconnection of a semiconductor device has many problems. For example, as interconnection becomes narrower and finer, the area of the connecting hole is reduced. This increase the amount of buried conductive material (having a high resistance) compare to the size of the connecting hole. As a result, the resistance of the buried interconnection increases and the reliability of the semiconductor device is deteriorated.

SUMMARY OF THE INVENTION

In order to overcome the aforementioned problems, it is an object of the present invention to provide an improved interconnection of a semiconductor device and a method for forming the same in which no barrier layer is formed in a connecting hole, thereby reducing the resistance of a buried interconnection.

It is another object of the present invention to provide a method for forming an interconnection of a semiconductor device in which a protecting film for preventing oxidation is formed on the sidewall of a conductive layer, thereby improving the contact resistance and the reliability of the interconnection.

In order to accomplish the above objects, there is provided a method for forming an interconnection of a semiconductor device, including the steps of forming an insulating layer on a substrate on which a lower conductive layer is formed, selectively removing the insulating layer to form a first connecting hole for an electrical connection and a second connecting hole for forming an upper conductive layer, the second connecting hole extending from the first connecting hole, growing a first conductive material in the first connecting hole to form a buried plug and then depositing a second conductive material on the surface of the insulating layer and buried plug to form a barrier layer, and forming a third conductive material on the barrier layer to fill the second connecting hole and then patterning it to form the upper conductive layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a method for forming an interconnection of a semiconductor device, including the steps of forming an insulating layer on a substrate having a lower conductor layer formed thereon, the insulating layer defining a hole portion extending from the lower conductor layer, filling the hole portion with a first conductive material to form a first conductive layer, forming a second conductive layer on the first conductive layer and the insulating layer, and forming a third conductive layer on the second conductive layer so as to form an interconnection of a semiconductor device.

Furthermore, the present invention is directed to a method for forming an interconnection of a semiconductor device, including the steps of forming a first insulating layer on a substrate having a lower conductor layer formed thereon, the first insulating layer defining a hole extending from the lower conductor layer, filling the hole with a first conductive material to form a first conductive layer, forming second and third insulating layers on the first insulating layer to define a trench above the hole, and forming second and third conductive layers in the trench so as to form an interconnection of a semiconductor device.

BRIEF DESCRIPTION OF THE ATTACHED DRAWINGS

The present invention will become more fully understood from the detailed description given hereinbelow and the accompanying drawings which are given by way of illustration only, and thus are not, limitative of the present invention, and wherein.

DETAILED DESCRIPTION OF THE PREFERRED EMBODIMENTS

Hereinafter, methods for forming an interconnection of a semiconductor device according to the embodiments of the present invention will be described with reference to the attached drawings.

FIGS. 2a to 2e are cross-sectional views for illustrating a method for forming an interconnection of a semiconductor device according to a first embodiment of the present invention.

In the first embodiment of the present invention, a trench for forming a connecting hole and an upper conductive line is formed on an insulating substrate having a lower conductive line formed thereon. Using the lower conductive line as a seed, a first conductive material is selectively grown to fill the connecting hole. After depositing a second conductive material as a barrier layer, a third conductive material is deposited to actually fill the trench.

The above method will be described below in detail referring to FIGS. 2a–2e.

Figure 2A:
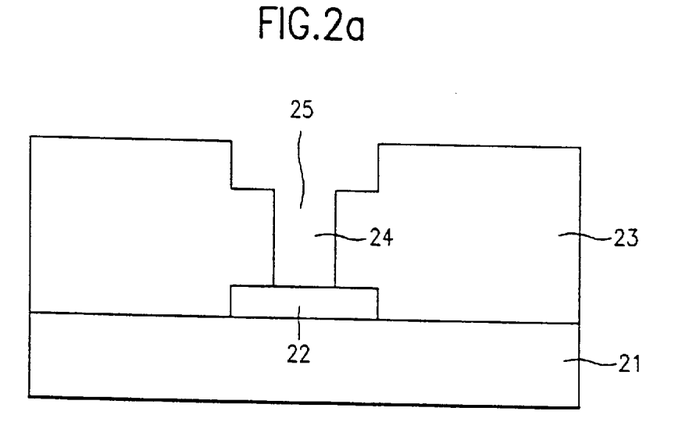
FIGS. 2a to 2e are cross-sectional views for illustrating a method for forming an interconnection of a semiconductor device according to a first embodiment of the present invention.

As shown in FIG. 2a, a lower conductive layer 22 is formed on a substrate 21, and an insulating layer 23 is formed on the substrate 21 and the lower conductive layer 22.

Then, a first photoresist (not shown) is coated and patterned thereon. Using the patterned photoresist as a mask, the insulating layer 23 is selectively removed to form a connecting hole 24 for connecting the lower conductive layer 22 with an upper conductive layer which will be formed in a subsequent process.

After removing the first photoresist, a second photoresist (not shown) is coated on the patterned insulating layer 23 and patterned. Using the patterned second photoresist as a mask, the insulating layer 23 is selectively removed to form a trench 25 for forming the upper conductive layer.

Figure 2B:
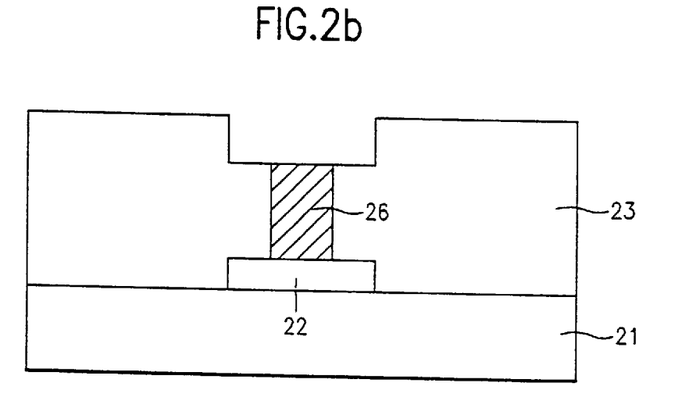

As show in FIG. 2b, using the lower conductive layer 22 as a seed, a first conductive material 26 is selectively grown on the lower conductive layer 22. Thus, the connecting hole 24 is filled with the first conductive material 26. At this time, as the first conductive material, a metal alloy such as an aluminum (Al) or silver (Ag) is used.

If the aluminum is used as the first conductive material, a metal organic CVD (MOCVD) apparatus is used to deposit the material. As a source of the organic metal used in the apparatus, a dimethylethylamine alane (DMEAA), i.e., $[(CH_3)_2(CH_3CH_2)N]AlH_3$ is used. This source is mixed with a carrier gas using a bubbler. At this time, the MOCVD apparatus has the pressure of 0.5~5 torr, the flux of 100~1000 sccm, and the temperature of 130~170° C.

Figure 2C:
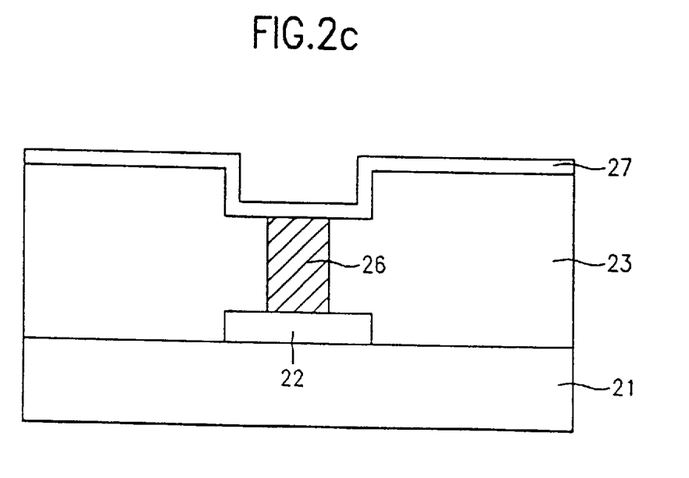

As shown in FIG. 2c, a second conductive material 27 is formed on the insulating layer 23 and first conductive material 26 which fills the connecting hole 24. At this time, the second conductive material 27 functions to prevent diffusion of a main material constituting the upper conductive layer which will be formed in a subsequent process. Further, the second conductive material 27 is used as a seed layer for growing the upper conductive layer. Accordingly, as the second conductive material, a metal compound such as TiN, TiW or a metal such as Ti, W is used and deposited using a sputtering or CVD method.

Figure 2D:
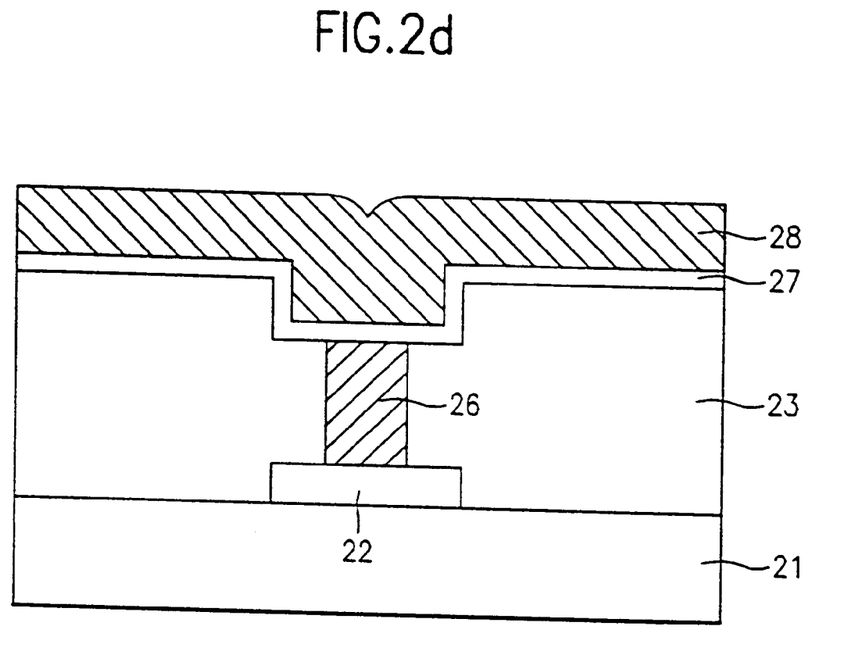

As shown in FIG. 2d, a third conductive material 28 is formed on the second conductive material 27 to fill the trench 25. When using copper (Cu) as the third conductive material 28, a MOCVD method with a liquid source such as (hfac)Cu(TMVS) (hexafluroacetylacetonate Cu trimethylvinylsilane) or a solid source such as $Cu(hfac)_2$ is used.

Meanwhile, in case that the main component constituting the third conductive material 28 is the same as that constituting the second conductive material 27, the process of forming the second conductive material 27 can be omitted.

Figure 2E:
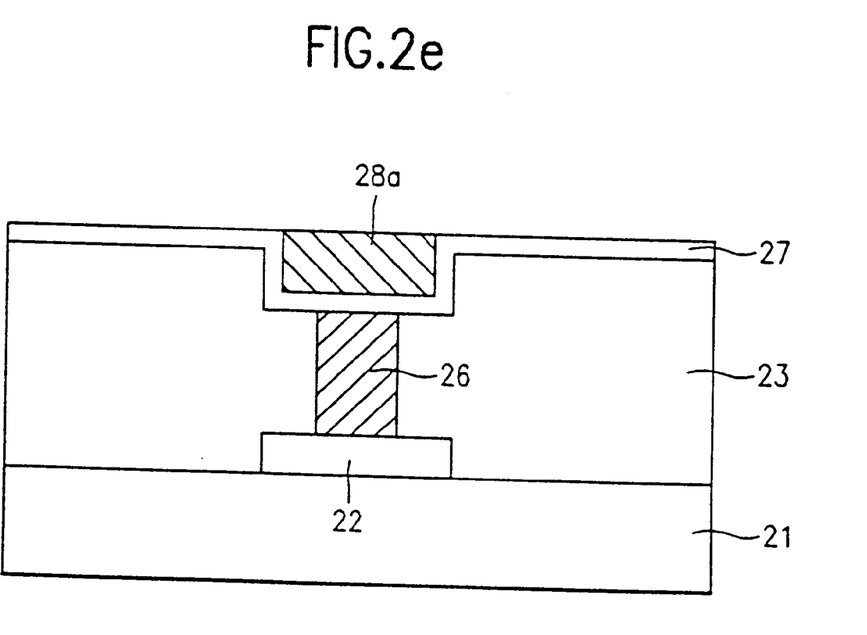

As shown in FIG. 2e, the third conductive material 28 and second conductive material 27 are etched back using a halogen group gas or a CMP method, thereby forming a pattern of the upper conductive layer 28a. Accordingly, an improved interconnection of a semiconductor device according to the first embodiment of the present invention is formed.

FIGS. 3a to 3e are cross-sectional views for illustrating a method for forming an interconnection of a semiconductor device according to a second embodiment of the present invention.

In the second embodiment of the present invention, a contact plug is formed first and then, a trench for an upper conductive line is formed. Thus, any contamination caused due to the selective loss after selectively growing a second conductive material can be prevented.

Figure 3A:
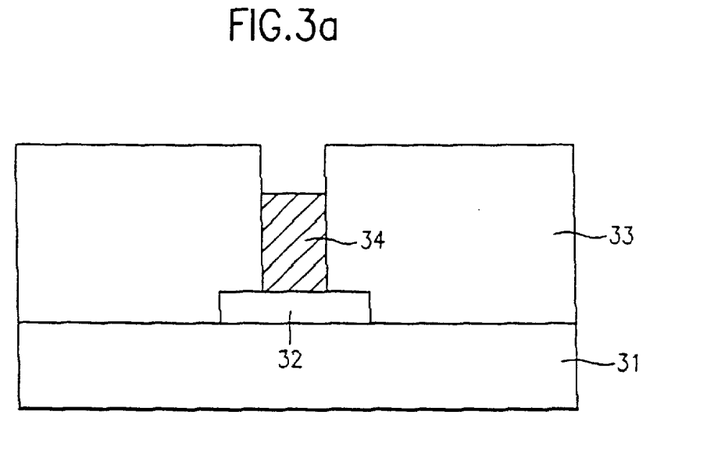
FIGS. 3a to 3e are cross-sectional views for illustrating a method for forming an interconnection of a semiconductor device according to a second embodiment of the present invention.

As shown in FIG. 3a, a lower conductive layer 32 is formed on a substrate 31, and an insulating layer 33 is formed on the substrate 31 and the lower conductive layer 32.

Then, a first photoresist (not shown) is coated and patterned thereon. Using the patterned first photoresist as a mask, the insulating layer 33 is selectively removed so as to expose a portion of the lower conductive layer 32, thereby forming a connecting hole for connecting an upper conductive layer which will be formed in a subsequent process.

Then, using the exposed lower conductive layer 32 as a seed, the first conductive material 34 is selectively grown in the connecting hole on the lower conductive layer 32. As the first conductive material 34, a metal alloy such as aluminum (Al) or silver (Ag) is used.

When using the aluminum as the first conductive material, a metal organic CVD (MOCVD) apparatus is used. As a source of the organic metal used in the MOCVD apparats, a dimethylethylamine alane (DMEAA), i.e., $[(CH_3)_2(CH_3CH_2)N]AlH_3$ is used, for example. This source is mixed with a carrier gas using a bubbler. At this time, the MOCVD apparatus has the pressure of 0.5~5 torr, the flux of 100~1000 sccm, and the temperature of 130~170° C.

Figure 3B:
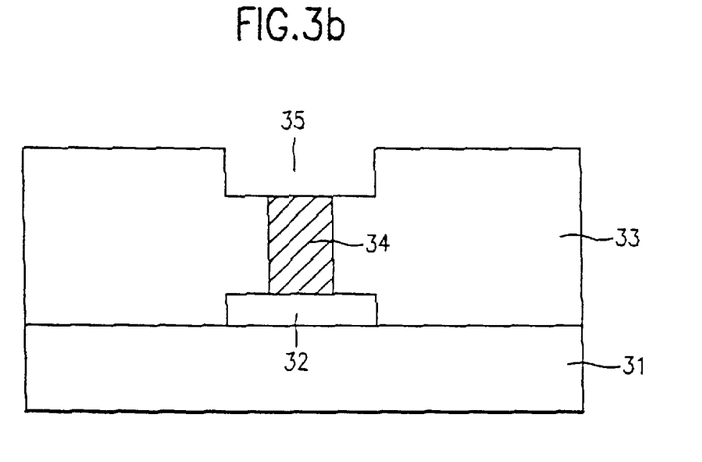

As shown in FIG. 3b, after coating a second photoresist (not shown), an upper conductive layer region 35 is defined. Using the patterned second photoresist as a mask, the insulating layer 33 is selectively removed to form a trench for forming the upper conductive layer. At this time, when the insulating layer 33 is selectively removed, any contamination material around the connecting hole is removed together.

Figure 3C:
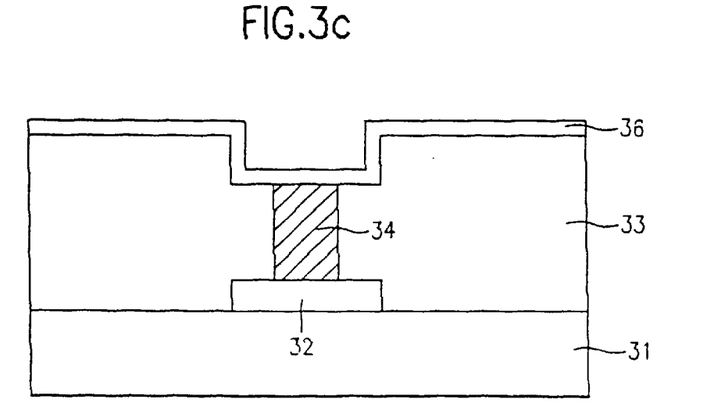

As shown in FIG. 3c, a second conductive material 36 is formed on the surface of first conductive material 34 and insulating layer 33.

Here, the second conductive material 36 functions to prevent diffusion of a main material constituting the upper conductive layer which will be formed in a subsequent processes. Further, the second conductive material 36 is used as a seed layer for growing the upper conductive layer. Accordingly, as the second conductive material, a metal compound such as TiN, TiW or a metal material such as Ti, W is used in a sputtering or CVD method.

Figure 3D:
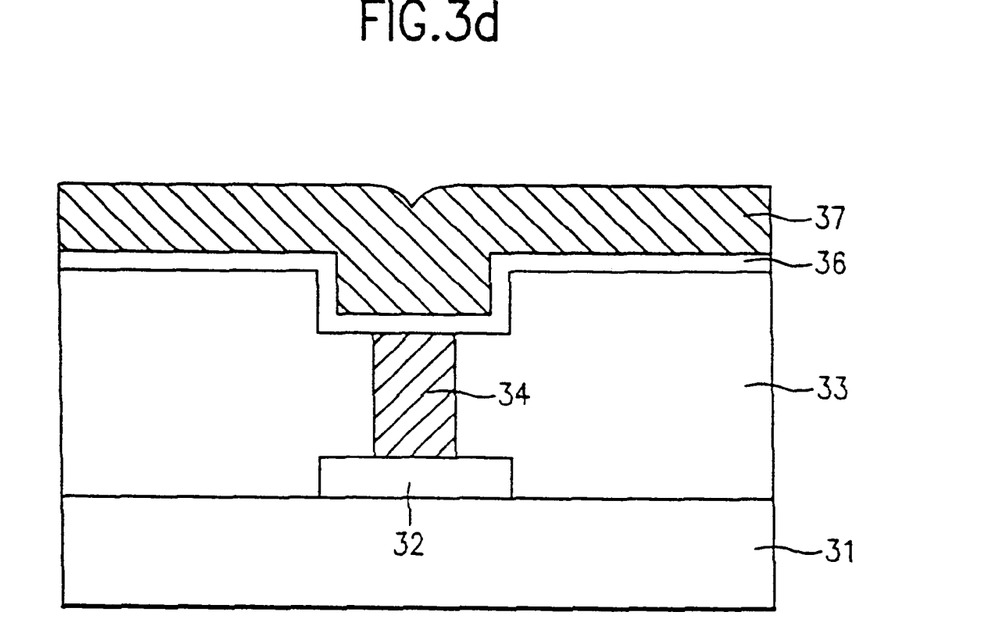

As shown in FIG. 3d, a third conductive material 37 is formed on the second conductive material 36. At this time, if copper (Cu) were used as the third conductive material 37, a MOCVD method using a liquid source such as (hfac)Cu (TMVS) or a solid source such as $Cu(hfac)_2$ is utilized.

Meanwhile, in case that the main component of the third conductive material 37 is the same material as that of the second conductive material 36, the process of forming the second conductive material 36 can be omitted.

Figure 3E:
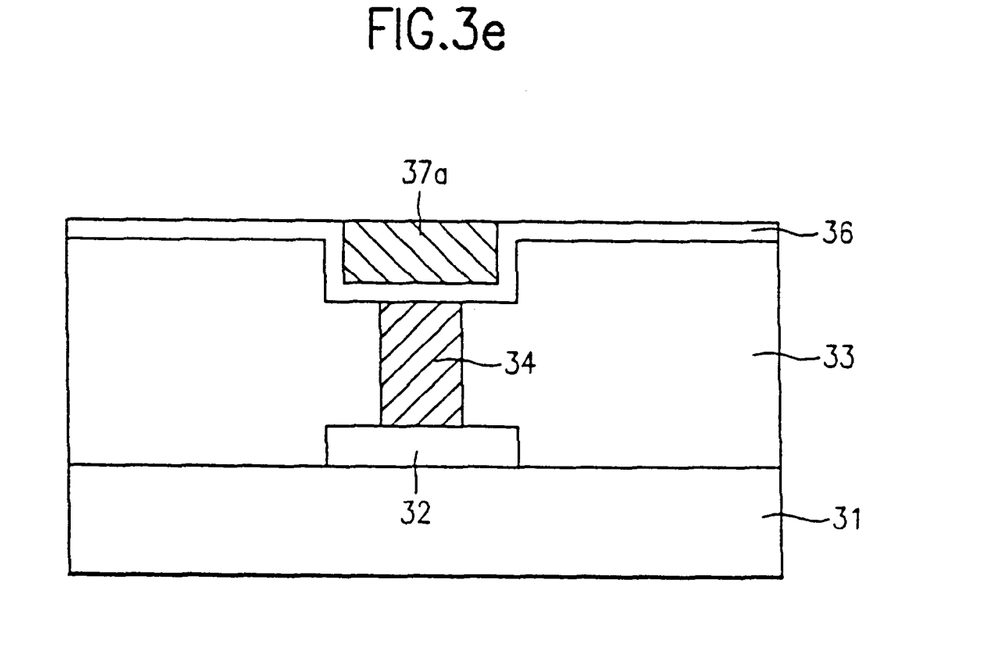

As shown in FIG. 3e, the third conductive material 37 and second conductive material 36 are etched back using a halogen group gas or a CMP method, thereby forming the pattern of upper conductive layer 37a. As a result, an improved interconnection of a semiconductor device according to the second embodiment of the present invention is formed.

Meanwhile, a third embodiment and a fourth embodiment of the present invention are methods whereby a protecting film is formed on the sidewall of an upper conductive layer for preventing the oxidation of the upper conductive layer, thereby improving the contact resistance and the reliability of the interconnection.

FIGS. 4a to 4f are cross-sectional views for illustrating a method for forming an interconnection of a semiconductor device according to a third embodiment of the present invention.

Figure 4A:
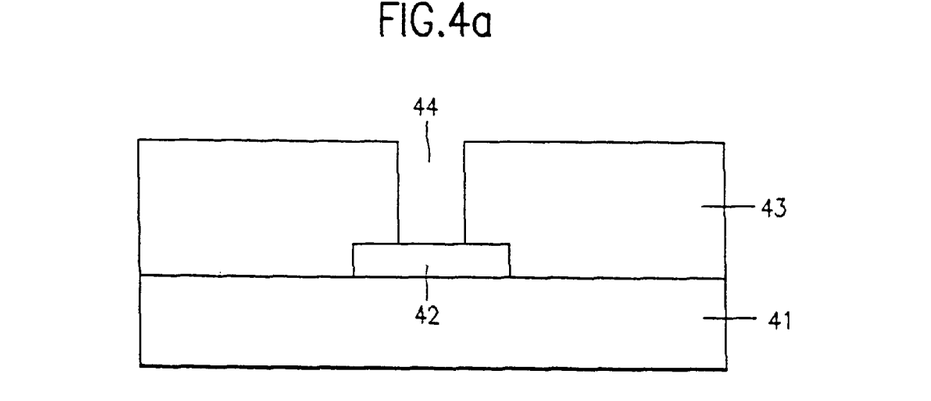
FIGS. 4a to 4f are cross-sectional views for illustrating a method for forming an interconnection of a semiconductor device according to a third embodiment of the present invention.

As shown in FIG. 4a, a lower conductive layer 42 is formed on a substrate 41, and a first insulating layer 43 is formed on the entire surface including the lower conductive layer 42.

Then, a first photoresist (not shown) is coated and patterned thereon. Using the patterned first photoresist as a mask, the first insulating layer 43 is selectively removed so as to expose a portion of the lower conductive layer 42, thereby forming a connecting hole 44 for connecting an upper conductive layer which will be formed in a subsequent process.

Figure 4B:
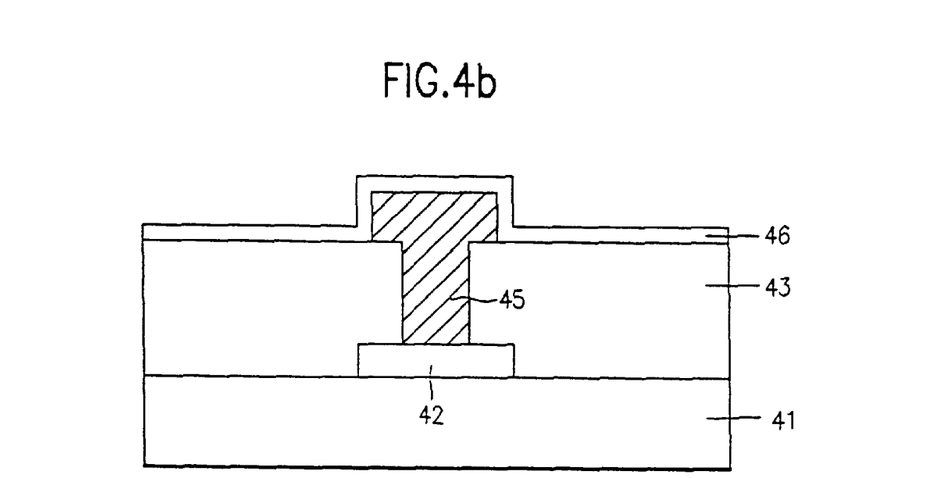

As shown in FIG. 4b, using the exposed lower conductive layer 42 as a seed, a first conductive material 45 is selectively grown in the connecting hole 44 on the lower conductive layer 42. At this time, the first conductive material 45 is grown up through the connecting hole 44 and over the first insulating layer 43.

Then, the first conductive material 45 formed on the first insulating layer 43 is selectively removed. Then, a second insulating layer 46 is formed on the first insulating layer 43 and first conductive material 45. As the first conductive material 45, a metal alloy such as aluminum (Al) or silver (Ag) is used, for example.

When using the aluminum as the first conductive material 45, a MOCVD apparatus with a source of the organic metal, e.g. DMEAA, i.e., $[(CH_3)_2(CH_3CH_2)N]AlH_3$, is used. The source is mixed with a carrier gas using a bubbler. At this time, the MOCVD apparatus has the pressure of 0.5~5 torr, the flux of 100~1000 sccm, and the temperature of 130~170° C.

Figure 4C:
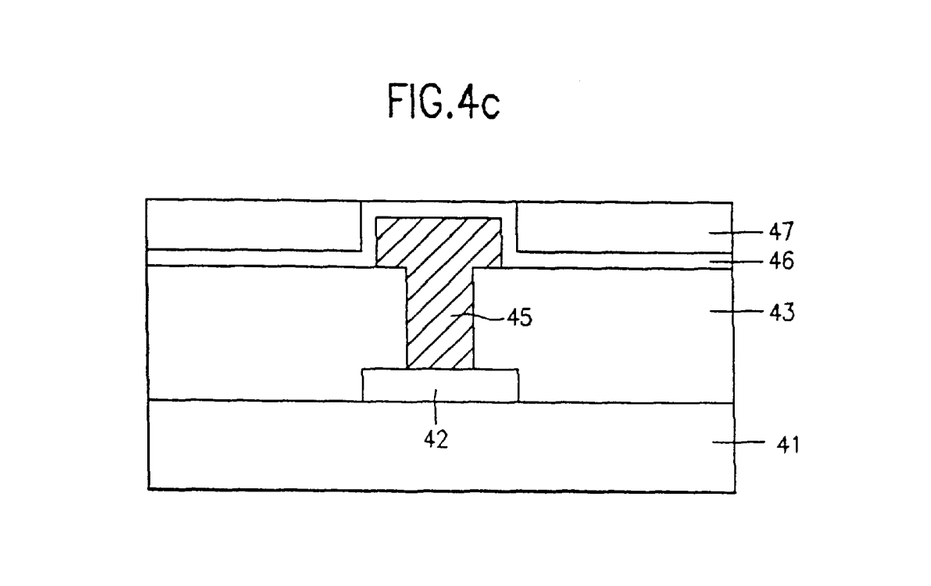

As shown in FIG. 4c, a third insulating layer 47 such as a silicon nitride film or a spin on glass (SOG) is formed on the second insulating layer 46. Using a CMP method, the resultant is etched back until the surface of the second insulating layer 46 is exposed.

Figure 4D:
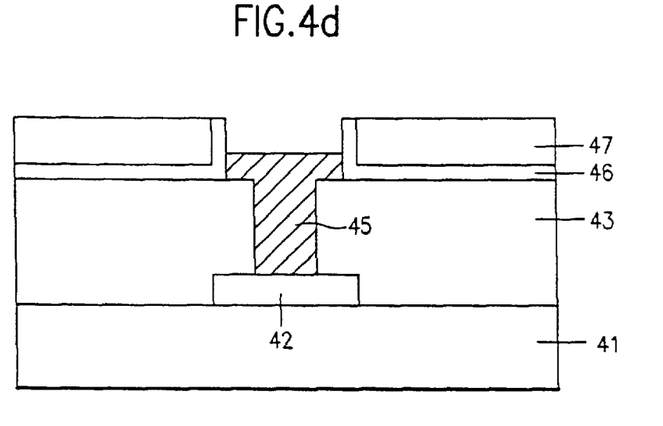

As shown in FIG. 4d, the exposed second insulating layer 46 is selectively etched to expose the surface of the first conductive material 45. Then, only the first conductive material 45 is etched to a predetermined depth.

Figure 4E:
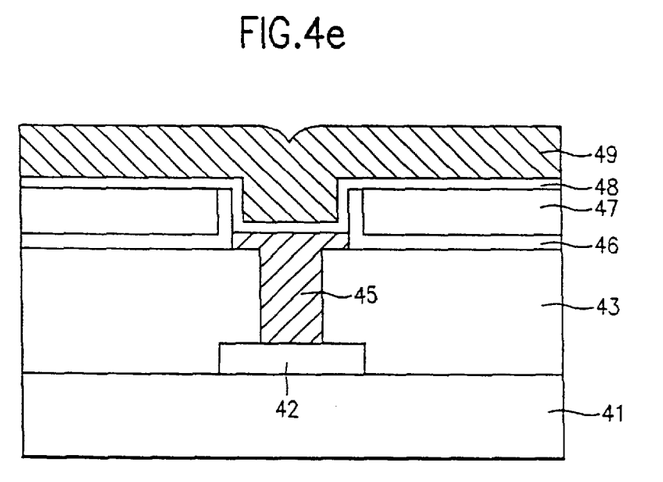

As shown in FIG. 4e, a second conductive material 48 and a third conductive material 49 are sequentially formed on the first conductive material 45 and the second and third insulating layers 46 and 47.

Figure 4F:
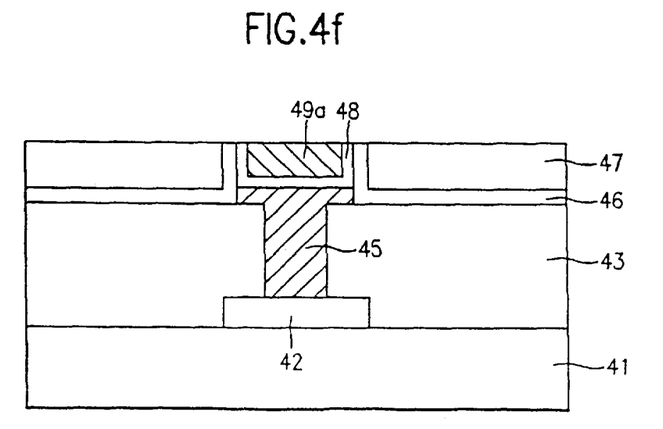

As shown in FIG. 4f, the third conductive material 49 and second conductive material 48 are etched back using a halogen group gas or a CMP method, thereby forming the pattern of the upper conductive layer 49a. As a result, an improved interconnection of a semiconductor device according to the third embodiment of the present invention is formed.

Here, the second conductive material 48 functions to prevent diffusion of a main material constituting the upper conductive layer, and is used as a seed layer for growing the upper conductive layer. Furthermore, in case that a copper (Cu) is used as the third conductive material 49, it is formed by a MOCVD method using a liquid source such as (hfac)Cu(TMVS) or a solid source such as $Cu(hfac)_2$.

FIGS. 5a to 5f are cross-sectional views for illustrating a method for forming an interconnection of a semiconductor device according to a fourth embodiment of the present invention.

Figure 5A:
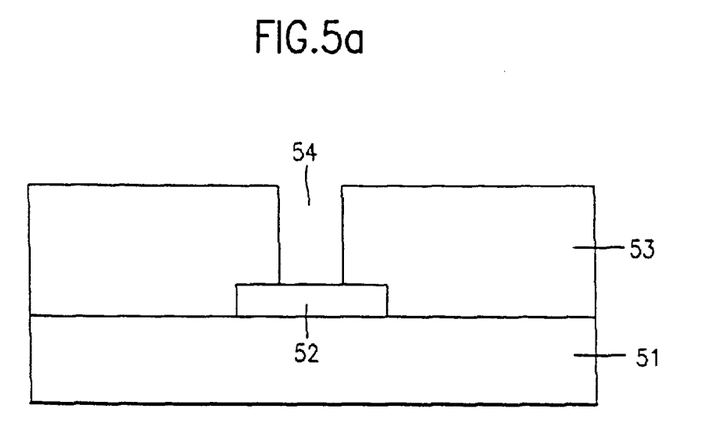
FIGS. 5a to 5f are cross-sectional views for illustrating a method for forming an interconnection of a semiconductor device according to a fourth embodiment of the present invention.

As shown in FIG. 5a, a lower conductive layer 52 is formed on a substrate 51, and a first insulating layer 53 is formed on the entire surface including the lower conductive layer 52. Then, a first photoresist (not shown) is coated and patterned thereon. Using the patterned first photoresist as a mask, the first insulating layer 53 is selectively removed so as to expose a portion of the lower conductive layer 52, thereby forming a connecting hole 54 for connecting an upper conductive layer which will be formed in a subsequent process.

Figure 5B:
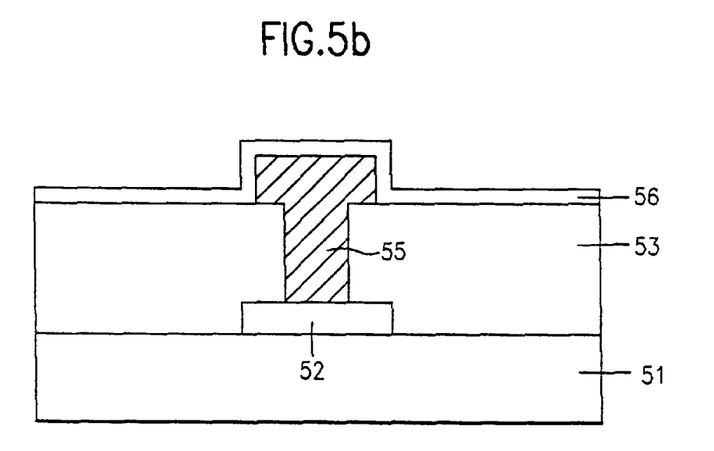

As shown in FIG. 5b, using the exposed lower conductive layer 52 as a seed, a first conductive material 55 is selectively grown in the connecting hole 54 on the lower conductive layer 52. At this time, the first conductive material 55 is grown up to the connecting hole 54 and over the first insulating layer 53 around the connecting hole 54.

Then, the first conductive material 55 formed on the first insulating layer 53 is selectively removed, and a second insulating layer 56 is formed on the first insulating layer 53 and the first conductive material 55. At this time, as the first conductive material 55, a metal alloy such as aluminum (Al) or silver (Ag) is used, for example.

When using the aluminum as the first conductive material 55, a MOCVD apparatus is used. At this time, as a source of the organic metal using in the MOCVD apparatus, a DMEAA, i.e., $[(CH_3)_2(CH_3CH_2)N]AlH_3$ is used, for example. This source is mixed with a carrier gas using a bubbler. At this time, the MOCVD apparatus has the pressure of 0.5~5 torr, the flux of 100~1000 sccm, and the temperature of 130~170° C.

Figure 5C:
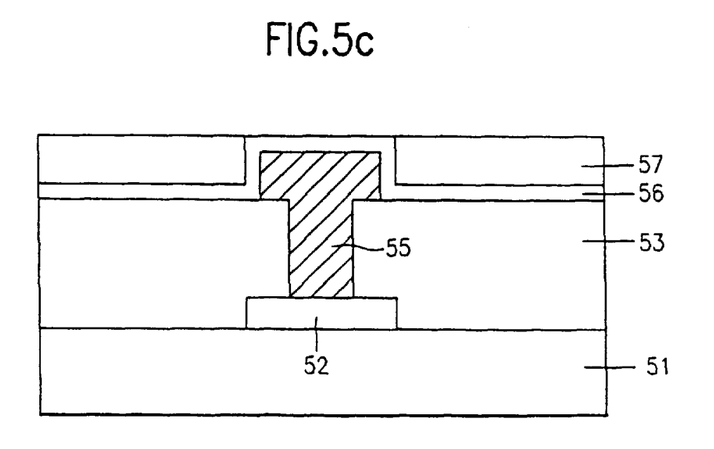

As shown in FIG. 5c, a third insulating layer 57 such as a silicon nitride film or a spin on glass (SOG) is formed on the second insulating layer 56. Using a CMP method, the third insulating layer 57 is removed by an etch-back process until the surface of second insulating layer 56 is exposed.

Figure 5D:
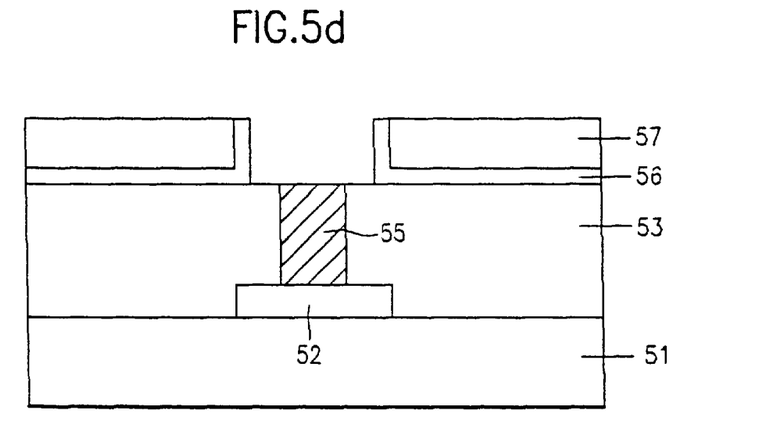

As shown in FIG. 5d, the exposed second insulating layer 56 is selectively etched to expose the surface of first conductive material 55. Then, the first conductive material 55 on the first insulating layer 53 and above the connecting hole 54 is removed so that only the connecting hole 54 is filled with the first conductive material 55.

Figure 5E:
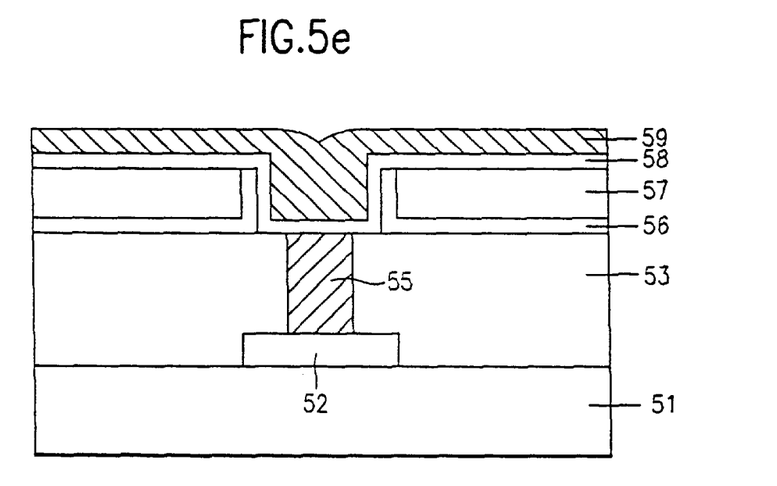

As shown in FIG. 5e, a second conductive material 58 and a third conductive material 59 are sequentially formed on the entire surface including the first conductive material 55 in the connecting hole 54.

Figure 5F:
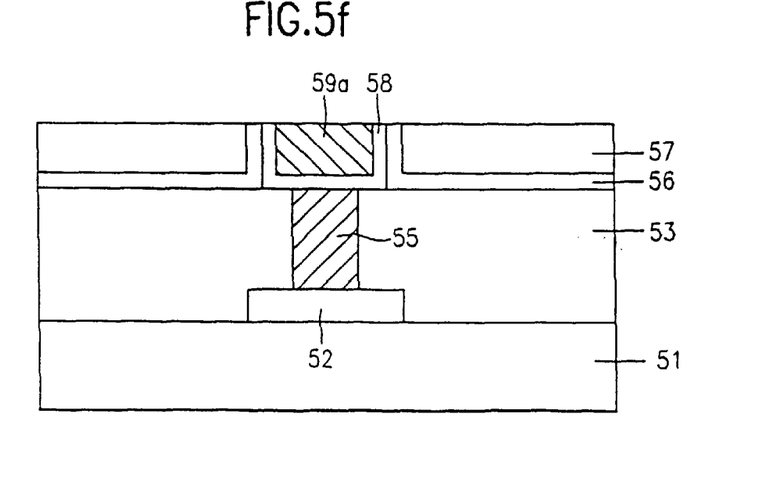

As shown in FIG. 5f, the third conductive material 59 and second conductive material 58 are etched back using a halogen group gas or a CMP method, thereby forming the pattern of the upper conductive layer 59a. As a result, an improved interconnection of a semiconductor device according to the fourth embodiment of the present invention is formed.

Here, the second conductive material 58 functions to prevent diffusion of a main material constituting the upper conductive layer and is used as a seed layer for growing the upper conductive layer. Furthermore, in case that a copper (Cu) is used as the third conductive material 59, it is formed by a MOCVD method using a liquid source such as (hfac)Cu(TMVS) or a solid source such as $Cu(hfac)_2$.

As described above, the methods for forming an interconnection of a semiconductor device according to the embodiments of the present invention offer many advantages. For example, since a plug filling a connecting hole is formed by a selective growth, no barrier layer is formed in the connecting hole. Thus, the resistance of the plug (buried interconnection) is reduced.

Moreover, a protecting film is formed on the sidewall of a conductive layer in order to prevent the oxidation of the is conductive layer. Thus, the contact resistance and the reliability of the interconnection are improved.

The invention being thus described, it will be obvious that the same may be varied in many ways. Such variations are not to be regarded as a departure from the spirit and scope of the invention, and all such modifications s would be obvious to one skilled in the art are intended to be included within the scope of the following claims.

What is claimed is:

1. A method for forming an interconnection of a semiconductor device, comprising the steps of:

forming an insulating layer on a substrate having a lower conductor layer formed thereon, the insulating layer defining a hole portion extending from the lower conductor layer;

filling the hole portion with a first conductive material to form a first conductive layer, by using a metal organic chemical vapor deposition with a pressure of 0.5–5 torr, a flux of 100–1000 sccm and a temperature of 130–170° C.;

forming a second conductive layer on the first conductive layer and the insulating layer; and forming a third conductive layer on the second conductive layer so as to form an interconnection of a semiconductor device.

2. A method for forming an interconnection of a semiconductor device as claimed in claim 1, wherein the second conductive layer is comprised of either a metal or a metal compound, the metal compound including TiN or TiW, and the metal including Ti or W.

3. A method for forming an interconnection of a semiconductor device as claimed in claim 1, wherein the second conductive layer prevents a diffusion of a main material constituting the third conductive layer.

4. A method for forming an interconnection of a semiconductor device as claimed in claim 1, wherein the third conductive layer includes copper (Cu).

5. A method for forming an interconnection of a semiconductor device as claimed in claim 4, wherein as a liquid source of the copper, (hfac)Cu(TMVS) is used and as a solid source of the copper, Cu(hfac)$_2$ is used.

6. A method for forming an interconnection of a semiconductor device as claimed in claim 1, wherein the step of forming the insulating layer includes the steps of:

forming a first connecting hole extending from a top surface of the lower conductor layer, and forming a second connecting hole extending from the first connecting hole, the first and second connecting holes forming the hole portion.

7. A method for forming an interconnection of a semiconductor device as claimed in claim 6, wherein the filling step is carried out prior to the step of forming the second connecting hole.

8. A method for forming an interconnection of a semiconductor device as claimed in claim 6, wherein the step of forming the second conductive layer includes the step of:

depositing a second conductive material so as to define a trench above the first connecting hole in the second connecting hole.

9. A method for forming an interconnection of a semiconductor device as claimed in claim 8, wherein the step of forming the third conductive layer includes the steps of:

depositing a third conductive material, and removing portions of the third conductive material so that an exposed surface of the third conductive material is substantially coplanar with surfaces of the second conductive layer surrounding the trench.

10. A method for forming an interconnection of a semiconductor device as claimed in claim 9, wherein the removing step includes the step of:

etching back the second conductive material and the third conductive material using a halogen group gas or a chemical mechanical polishing (CMP) method.

11. A method for forming an interconnection of a semiconductor device as claimed in claim 9, wherein the third conductive material is comprised of copper (Cu).

12. A method for forming an interconnection of a semiconductor device as claimed in claim 11, wherein as a liquid source of the copper, (hfac)Cu(TMVS) is used, and as a solid source of the copper, Cu(hfac)$_2$ is used.

13. A method for forming an interconnection of a semiconductor device as claimed in claim 8, wherein the second conductive material is comprised of either a metal compound including TiN or TiW, or a metal including Ti or W.

14. A method for forming an interconnection of a semiconductor device as claimed in claim 1, wherein the first conductive material is comprised of one of aluminum (Al), silver (Ag), and a metal alloy thereof.

15. A method for forming an interconnection of a semiconductor device as claimed in claim 14, wherein when the first conductive material is comprised of the aluminum, the metal organic chemical vapor deposition is carried out to deposit the first conductive material using dimethylethylamine alane (DMEAA) as a source of a organic metal.

16. A method for forming an interconnection of a semiconductor device, comprising the steps of:

forming a first insulating layer on a substrate having a lower conductor layer formed thereon, the first insulating layer defining a hole extending from the lower conductor layer;

filling the hole with a first conductive material to form a first conductive layer;

forming second and third insulating layers on the first insulating layer to define a trench above the hole; and forming second and third conductive layers in the trench so as to form an interconnection of a semiconductor device, wherein the step of forming the second and third insulating layers includes the steps of, forming the second insulating layer on the first insulating layer and on the first conductive layer, and forming the third insulating layer on the second insulating layer.

17. A method for forming an interconnection of a semiconductor device as claimed in claim 16, wherein the filling step includes the steps of:

growing the first conductive material in the hole and over the first insulating layer, and selectively removing portions of the first conductive material.

18. A method for forming an interconnection of a semiconductor device as claimed in claim 16, wherein the step of forming the second and second insulating layers further includes the step of:

removing portions of the third insulating layer and a portion of the first conductive layer to define the trench.

19. A method for forming an interconnection of a semiconductor device as claimed in claim 16, wherein the step of forming the second and third conductive layers includes the steps of:

deposing a second conductive material on the first conductive layer to form the second conductive layer, deposing a third conductive layer over the deposited second conductive material to form the third conductive layer, and removing portions of the second and third conductive materials so that an exposed surface of the third conductive material is substantially coplanar with a surface of the third insulating layer.

20. A method for forming an interconnection of a semiconductor device as claimed in claim 19, wherein the removing step includes the step of:

etching back the second and third conductive materials using a halogen group gas or a chemical mechanical polishing (CMP) method.

21. A method for forming an interconnection of a semiconductor device as claimed in claim 16, wherein the first conductive material is comprised of either a metal or a metal alloy thereof, the metal including aluminum (Al) or silver (Ag).

22. A method for forming an interconnection of a semiconductor device as claimed in claim 21, wherein when the first conductive material is comprised of the aluminum, a metal organic chemical vapor deposition is carried out to deposit the first conductive material using dimethylethylamine alane (DMEAA) as a source of a organic metal.

23. A method for forming an interconnection of a semiconductor device as claimed in claim 22, wherein during the organic chemical vapor deposition, pressure of 0.5~5 torr, flux of 100~1000 sccm and temperature of 130~170° C. are obtained.

24. A method for forming an interconnection of a semiconductor device as claimed in claim 16, wherein the second conductive layer is comprised of either a metal compound including TiN or TiW, or a metal including Ti or W.

25. A method for forming an interconnection of a semiconductor device as claimed in claim 16, wherein the second conductive layer functions to prevent a diffusion of a main material constituting the third conductive layer.

26. A method for forming an interconnection of a semiconductor device as claimed in claim 16, wherein the third conductive layer is comprised of copper (Cu).

27. A method for forming an interconnection of a semiconductor device as claimed in claim 26, wherein a liquid source of the copper includes (hfac)Cu(TMVS) and a solid source of the copper includes Cu(hfac)$_2$.

28. A method for forming an interconnection of a semiconductor device, comprising the steps of:

forming a first insulating layer on a substrate having a lower conductor layer formed thereon, the first insulating layer defining a hole extending from the lower conductor layer;

filling the hole with a first conductive material to form a first conductive layer, by using a metal organic chemical vapor deposition having a pressure of 0.5–5 torr, a flux of 100–1000 sccm, and a temperature of 130–170° C.;

forming second and third insulating layers on the first insulating layer to define a trench above the hole; and forming second and third conductive layers in the trench so as to form an interconnection of a semiconductor device.

29. A method for forming an interconnection of a semiconductor device as claimed in claim 28, wherein the step of forming the second and third insulating layers includes the steps of:

forming the second insulating layer on the first insulating layer and on the first conductive layer, and forming the third insulating layer on the second insulating layer.

* * * * *